(12) United States Patent  
Shalash

(10) Patent No.: US 7,570,934 B2  
(45) Date of Patent: Aug. 4, 2009

(54) AUTOMATIC GAIN CONTROL CIRCUIT

(75) Inventor: Ahmed F. Shalash, Old Bridge, NJ (US)

(73) Assignee: Analog Devices, Inc., Norwood, MA (US)

( * ) Notice: Subject to any disclaimer, the term of this patent is extended or adjusted under 35 U.S.C. 154(b) by 498 days.

(21) Appl. No.: 11/406,505

(22) Filed: Apr. 18, 2006

(65) Prior Publication Data

US 2007/0243843 A1    Oct. 18, 2007

(51) Int. Cl.
  *H04B 1/06* (2006.01)
(52) U.S. Cl. .............. 455/240.1; 455/260; 455/341; 375/345
(58) Field of Classification Search ............ 455/232.1, 455/234.1, 240.1, 250.1, 255–260, 339–341; 375/345
  See application file for complete search history.

(56) References Cited

U.S. PATENT DOCUMENTS

| 7,109,792 B2* | 9/2006 | Leffel .................... 330/149 |
| 7,145,964 B2* | 12/2006 | Hoffmann et al. ........... 375/298 |
| 2002/0142745 A1 | 10/2002 | Kang et al. .............. 455/232.1 |
| 2004/0048592 A1* | 3/2004 | Yamanaka ................ 455/234.1 |
| 2004/0152432 A1 | 8/2004 | Gu ....................... 455/136 |
| 2004/0229586 A1 | 11/2004 | Oshima et al. ............ 455/240.1 |
| 2006/0178165 A1* | 8/2006 | Vassiliou et al. ......... 455/552.1 |

FOREIGN PATENT DOCUMENTS

| EP | 1 303 053 A1 | 4/2003 |
| EP | 1 326 347 A2 | 7/2003 |
| EP | 1 355 419 A2 | 10/2003 |

OTHER PUBLICATIONS

Authorized Agent Améla Michl, *International Search Report and the Written Opinion of the International Searching Authority*, International Application No. PCT/US2007/062893, Jul. 23, 2007, 12 pages.

* cited by examiner

*Primary Examiner*—Nhan T Le
(74) *Attorney, Agent, or Firm*—Bromberg & Sunstein LLP

(57) ABSTRACT

An automatic gain control circuit is disclosed. The automatic gain control circuit receives a radio frequency signal at an input. The input passes the radio frequency signal to a first gain loop having a changeable gain. A low pass filter filters the radio frequency signal. In a second gain loop, the gain of the filtered signal is adjusted. The automatic gain control circuit includes at least one signal detector for detecting a signal level in the first gain loop and a signal level in the second gain loop. The automatic gain control circuit also includes an adjustment module for adjusting the gain of the first and second gain loops based upon the detected signal levels wherein overall gain of the first and the second gain loops is increased no greater than a predetermined value.

17 Claims, 8 Drawing Sheets

AUTOMATIC GAIN CONTROL CIRCUIT

TECHNICAL FIELD AND BACKGROUND ART

The present invention relates to gain control of a signal and more specifically to automatic gain control of a signal that can fluctuate regularly over time.

Radio frequency transmissions of signal often encounter interference from various sources including multipath, overlapping signals, and noise. The interference can result in changes to the amplitude of the desired signal at a receiver, especially, if the receiver is moving. Thus, in order to keep the signal level substantially constant gain control circuitry has been incorporated into receivers.

SUMMARY OF THE INVENTION

An automatic gain control circuit is disclosed. The automatic gain control circuit includes an input for receiving in a radio frequency signal. The radio frequency signal carries digital data representative of digital data. The circuit includes a first gain loop and a second gain loop. The first gain loop has a changeable gain that changes the gain of the radio frequency signal. Also included in the automatic gain control circuit is a filter for filtering noise and other interfering signals from the radio frequency signal. The filter also has a modifiable gain. The filtered radio frequency signal is received by the second gain loop. Each gain loop includes a signal detector for detecting a signal level of the signal received by the loop. One or more adjustment modules are included for adjusting the gain of the first and the second gain loops based upon the detected signal levels in a stepwise manner. The adjustment module adjusts the gain so that the gain of the first and second loops is increased no greater than a predetermined value.

In one embodiment, the first gain loop includes a programmable amplifier and in other embodiments, there are a plurality of programmable amplifiers in the first loop including an RF amplifier and a baseband amplifier. In certain embodiments, the second gain loop operates substantially in the digital domain and includes an analog-to-digital converter for converting the filtered radio frequency signal into the digital domain.

The adjustment module balances the gain increases and decreases between the first and second loops and gives preference to the first gain loop. The adjustment module accesses a look-up table for setting the gains of the amplifiers in the first and second loops based upon the input RF signal and the present state of the gain settings for the amplifiers. The look-up table contains gain settings that are based on empirical data.

As already stated, the received RF signal includes digital data and the digital data is output from the second loop. The digital data forms a plurality of symbols and the symbols are received at a symbol rate. The gains of the first gain loop and the second gain loop can be updated at the symbol rate. In certain embodiments, depending on the level of the received signal the gains of the first and second loops may be updated at a rate that is faster than the symbol rate.

In certain embodiments the gain in the first and second loops can only be adjusted stepwise, for example in 3 dB or 6 dB increments.

BRIEF DESCRIPTION OF THE DRAWINGS

The foregoing features of the invention will be more readily understood by reference to the following detailed description, taken with reference to the accompanying drawings, in which:

FIG. 3A shows a flow chart of a default mode for the on/off control module in one embodiment;

FIG. 3B shows a flow chart of an advanced mode for the on/off control module in one embodiment;

DETAILED DESCRIPTION OF SPECIFIC EMBODIMENTS

Figure 1:
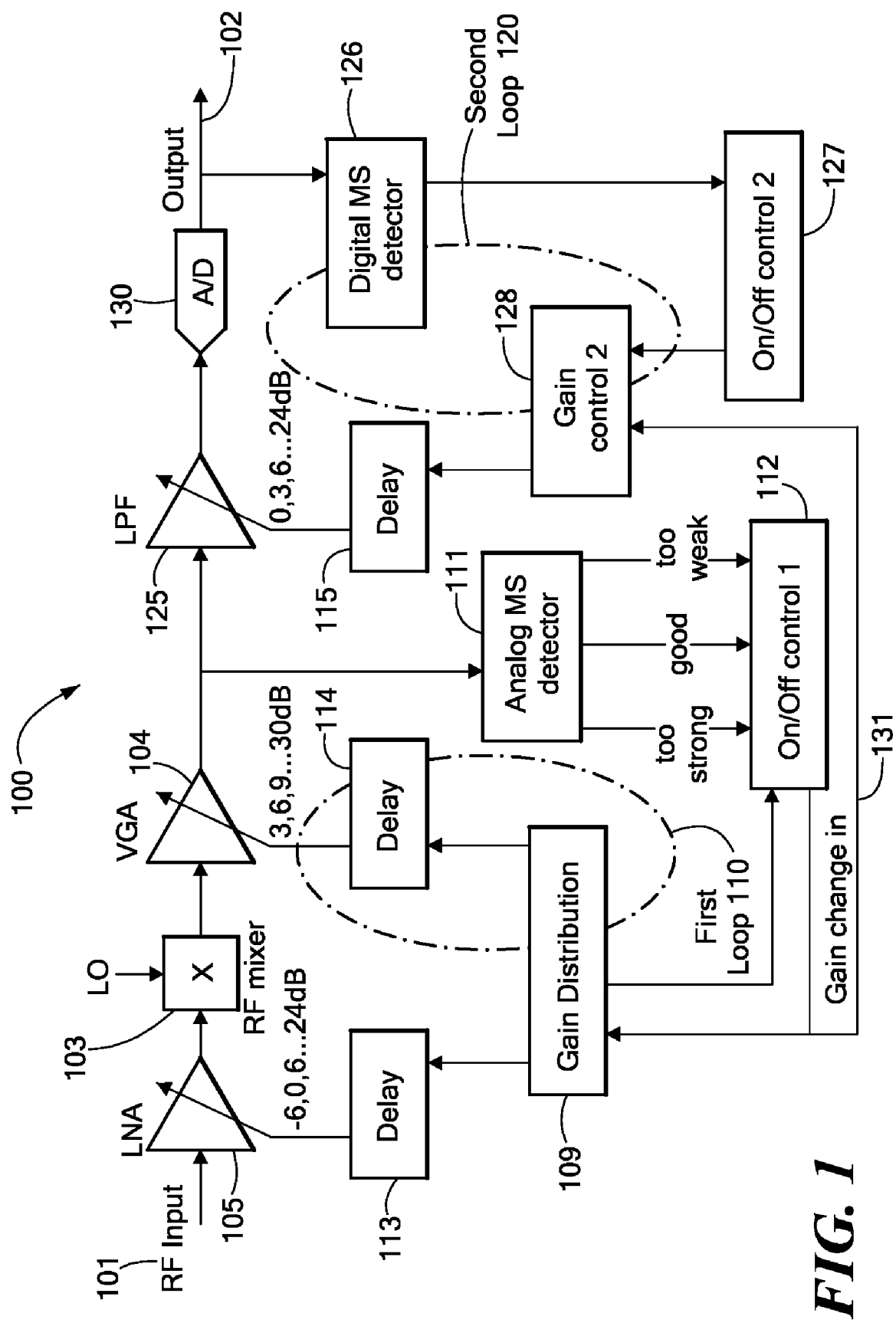
FIG. 1 is shows a first embodiment of the invention for automatic gain control.

FIG. 1 shows a circuit for automatic gain control (AGC) 100 used in direct conversion analog front-end. The automatic gain control circuit 100 receives in at its input a radio frequency signal 101 and outputs a series of digital samples 102. The radio frequency signal includes a modulated series of digital symbols modulated using a known modulation scheme, such as Orthogonal Frequency Division Multiplexing (OFDM). Please note that for direct conversion analog front-end circuits, FIG. 1 only shows half of the AGC circuit. Thus, there would be two separate circuits, the first circuit for the I-channel and the second for the Q-channel wherein the two signals are 90 degrees out of phase. Although, the OFDM modulation scheme is used throughout this description, other modulation schemes may also be used with embodiments of the invention.

In order to produce digital symbols having substantially the same amplitude at the output, the circuit 100 includes a plurality of gain loops. The first gain loop 110 operates on the radio frequency signal and feeds back a control signal to a plurality of amplifiers for controlling the gain of the amplifiers. The second gain loop 120 includes a low pass filter (LPF) 125. The LPF 125 filters out other signals and noise that exist outside of the frequency band for the desired radio frequency signal. The second gain loop 120 includes an analog-to-digital converter 130 that converts the analog signal into digital bits representative of the modulation symbols and passes the symbols to the output. Additionally, the loop includes gain adjustment for the LPF. Thus, after the desired signal is filtered, the gain of the desired signal can be increased. The gain adjustment takes into account the gain from the first gain loop and the desired output level for the symbols. The automatic gain control limits the overall gain that is provided to the signal between the RF input and the output. In practice, OFDM signals representing audio can experience between a 3 dB and 6 dB increase or decrease in gain without creating excessive noise.

Figure 2A:
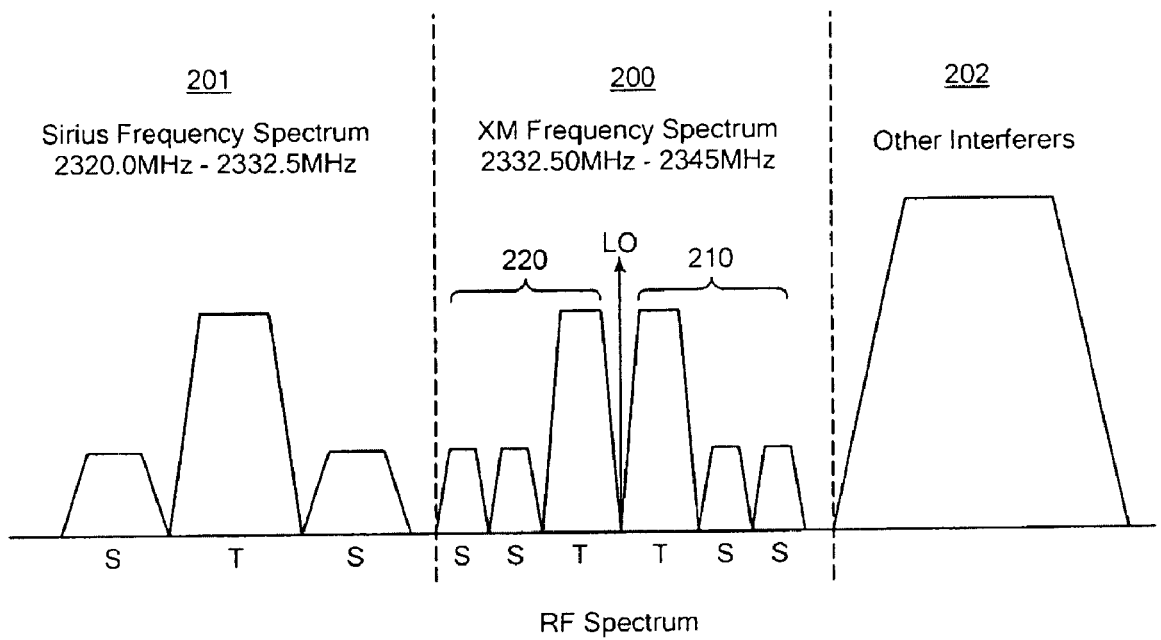
FIG. 2A shows an example of signal within the radio frequency proximate to the desired signal.
Figure 2B:
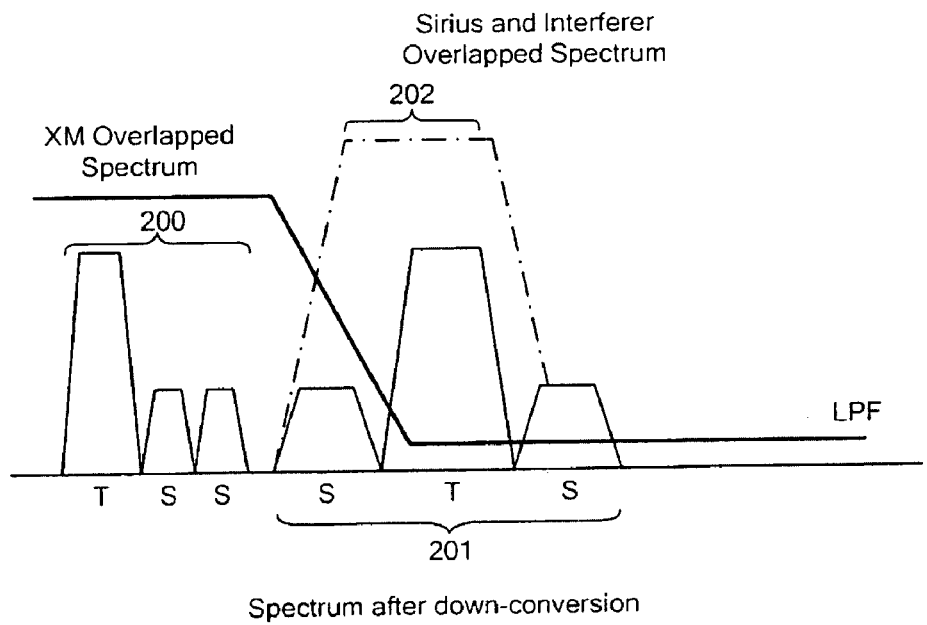
FIG. 2B shows the desired signal down-converted within the spectrum.

FIG. 1 is now explained in more detail. The radio frequency signal 101 is received into a low noise amplifier 102 that has an adjustable gain. The gain of the RF signal is adjusted by the first feedback loop 110 and the signal is passed through an RF mixer 103. The RF mixer 103 does a direct down-conversion of the RF signal to the base band. The RF signal when received may include various radio frequency signals and other interferes. For example, if the desired signal is a terrestrial variant of an XM satellite radio signal within the 2332.5 MHz-2345 MHz range, the RF signal may also contain a satellite variant of the XM radio signal, a Sirius satellite and terrestrial radio signals between 2320.0 MHz-2332.5 MHz and other interfering signals in the range 2345 MHz and above as shown in FIG. 2A (wherein terrestrial signals are denoted with a T and satellite signals are denoted with an S). The RF mixer 103 down converts the signal so that the terrestrial XM signal is lowered to a base band. The other interfering signals are moved to a high frequency region of the base-band spectrum as shown in FIG. 2B. The mixer output is passed to a base-band amplifier having a variable gain (VGA) 104. The gain is increased or decreased depending on the determination of the gain distribution module 109. The VGA 104 is preferably a low noise base-band amplifier that is used to raise the level of the signal prior to passing it to the LPF 125. After the signal is down-converted the signal may overlap with other signals. For example, as shown in FIG. 2A the XM spectrum 200 contains two frequency sections (high 210 and low 220) divided by the frequency marked LO 225. In FIG. 2B a portion of the down converted XM signals 200 originally within the high frequency band overlap the XM signals in the low frequency band. Additionally, the down-converted Sirius signals 201 overlap with the other interfering signals 202. The LPF 125 filters out the Sirius signals and the other interfering signals, so that the XM signal can be reconstructed in the digital domain from the I and Q channels outputs. In this first loop 110, the RF signal is passed to an Analog Mean Squared (MS) 111 detector that detects the power of the signal. Based upon the power level, the Analog MS detector passes a signal indicative of the level of the radio frequency signal to a control module (ON/Off control 1) 112. The Analog MS detector 111 may indicate that the signal is too strong, good, or too weak.

In one embodiment, the analog MS detector 111 provides one of five possible output signals including: the signal is less than 6 dB weak, the signal is between 3 dB and 6 dB weak, the signal is good, the signal is between 3 dB and 6 dB too strong, and the signal is greater than 6 dB too strong. These five signals can be represented as bit patterns. For example, four bits could be used to represent the five different outputs. As shown in FIG. 1, 0000=less than 6 dB weak, 0001=between 3-6 dB weak, 0011=signal is good, 0111=between 3-6 dB strong and 1111=greater than 6 dB strong.

The control module 112 indicates whether the gain of the first loop should be increased, left the same or decreased. The control module 112 determines the gain based upon a present state (signal) using a state machine and logic. Operation of the control module 112 is explained with reference to FIGS. 3A and 3B. The control module forwards the gain setting to the gain distribution module 109. The gain distribution module 109 employs a look-up table and based upon the previous settings determines whether the gain of the LNA 105 and VGA 104 will be increased, left the same or decreased. The methodology for making this decision will be further explained below. The circuitry also includes delay blocks 113, 114 that receive the gain distribution signal from the gain distribution module for the LNA 105 and the VGA 104. The delay blocks 113, 114, 115 of the first and second loops are included in order to synchronize the updating of the gain between the amplifiers 105, 104, 125. In one embodiment, the LNA 105 can vary the gain between −6 dB and 24 dB, while the VGA 104 can vary the gain between 3-30 dB, and the LPF can vary the gain between 0-24 dB. These gains are provided for illustrative purposes and other gains may be appropriate depending on various system sensitivities, as well as, the nature of the RF signal.

The LPF 125 receives the down-converted RF signal and the LPF 125 filters out a large portion of the undesired signals. In addition, the LPF 125 has a gain component that can either increase, decrease, or leave the gain the same for the filtered signal. The filtered baseband signal is next processed with an analog to digital converter 130. The digital signal that is output is representative of sampled data. The second gain loop includes a digital MS detector 126. The digital MS detector 126 outputs the amplitude value in the form of a signal to a digital control module also known as an on/off control module 127. The digital control module (on/off control 2) 127 sends gain signal 131 for the first loop 110 to a gain control module 120. The gain control module 128 receives both the output of the digital control module and also the gain signal 131. The gain control module then makes a determination about the change in gain of the LPF 125 based on the gain signal 131 of the first loop and a proposed gain for the second loop from the on/off control 127.

Figure 3B:
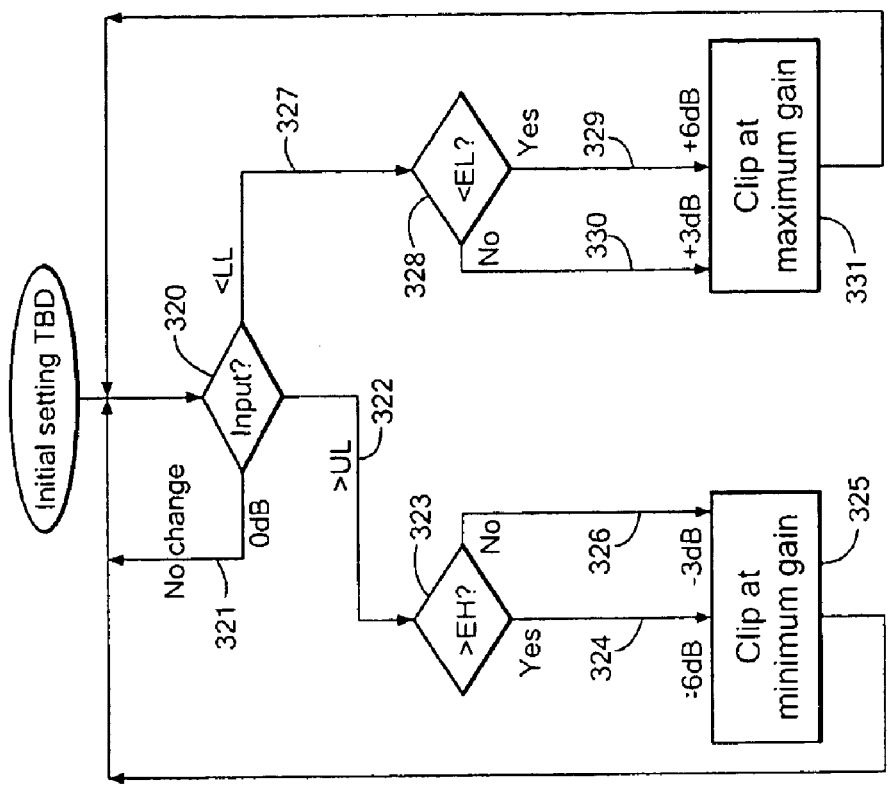
FIGS. 3A and 3B show two possible modes of operation for the on/off control module of the first loop.
Figure 3A:
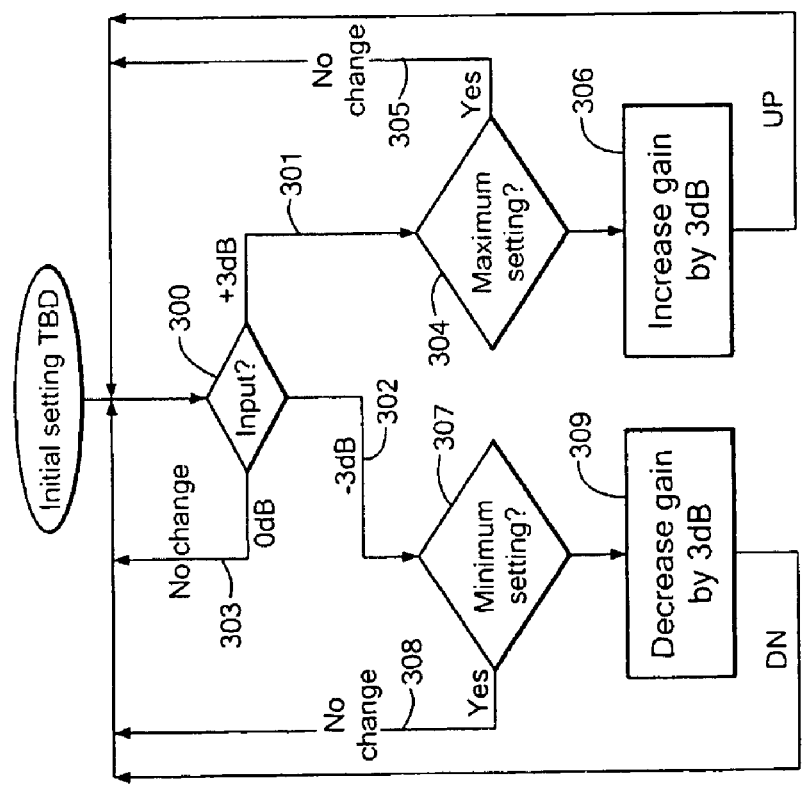

FIGS. 3A and 3B show two possible modes of operation for the on/off control module of the first loop. In FIG. 3A the gain is changed by only 3 dB at a time. In such an embodiment, there would be only three possible outputs (raise the gain by 3 dB, lower the gain by 3 dB, or leave the gain unchanged). First the input signal 300 is received and the power level is evaluated and compared to the expected power level. Based upon the comparison, one of the three possible events results. Either the power level is 3 dB greater than the expected value 301, 3 dB less than the expected value 302 or between −3 dB and +3 dB of that expected 303. If the signal is 3 dB below the expected value the state machine checks to see if the maximum setting has been reached 304. If the answer is yes, no change to the gain is made 305. If the maximum setting is not reached, then the gain is increased by 3 dB 306 and the loop continues to monitor the power level of the input signal. If the signal is 3 dB above the expected value 301, the state machine checks to see if the minimum setting has been reached 307. If the answer is yes 308, no change to the gain is made. If the minimum setting is not reached, then the gain of the loop is decreased by 3 dB 309 and the loop continues to monitor the power level of the input signal. If the power level is between −3 dB and +3 dB, then the power level is maintained for the input signal and the loop continues to monitor the input signal.

FIG. 3B shows an alternative flow chart to FIG. 3A in which the input is evaluated to see if it meets one of five different criteria. In this flowchart, the input is received 320 and evaluated against a desired power level. If the input is within +or −3 dB of the desired value 321 the gain is not varied and the system continues to monitor the input signal. If the power level is greater than 3 dB above the desired power level 322, the system inquires as to whether it is greater than 6 dB above the desired level 323. If the power is greater than 6 dB of the desired power level, the gain is set to be reduced by 6 dB 324. The system compares the reduced value to a minimum gain 325. If the value is below the minimum gain, no change to the gain is made and the system continues to monitor the input. If the reduced value is not below the minimum gain then, the system will adjust the gain by 6 dB and the input is again monitored. If the power level is not above 6 dB 326, then the system will reduce the gain by 3 dB. The system also checks to see if the minimum gain is reached 325. If the minimum gain is reached, then no change is performed to the gain. If the minimum gain has not been reached, then the power is reduced by 3 dB. In a similar fashion, when the input signal is received, the system queries whether the gain is 3 dB less then the desired power level 327. If the answer is yes, the system queries again to see if the gain is 6 dB less than the desired power level 328. If the gain is 6 dB down, the system will increase the gain by 6 dB 329, but will clip the gain at a maximum value if reached 331. If the gain is not 6 dB down, then the gain is between 3 dB and 6 dB down and therefore, the system will increase the gain by 3 dB so long as the maximum gain has not been reached. The system continuously adjusts the gain. The gain can be adjusted on an OFDM symbol by symbol basis, multiple OFDM symbol basis or on a partial OFDM symbol basis.

Figure 4:
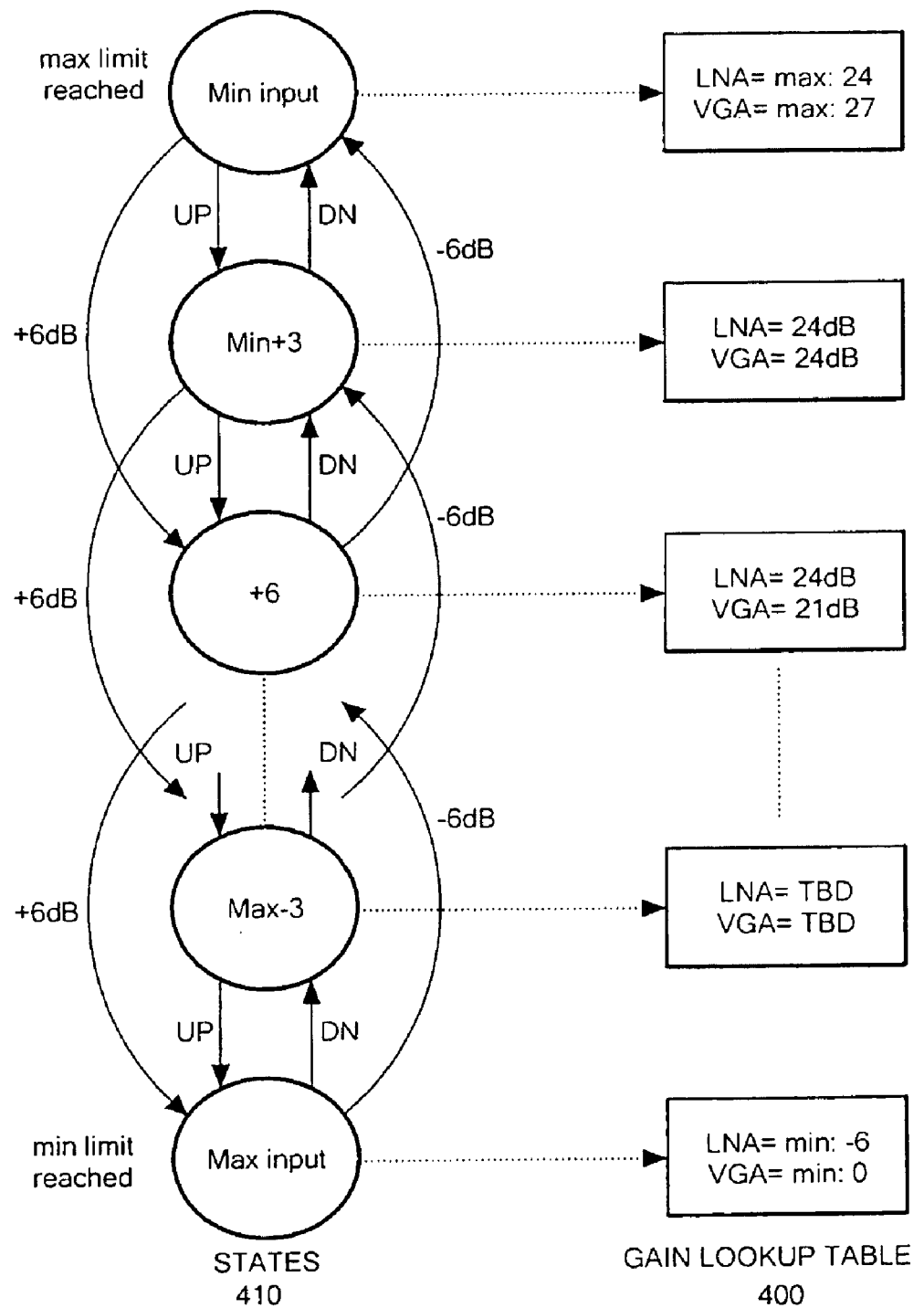
FIG. 4 is an example of a state machine operating within the first loop.

The gain distribution block 109 shown in FIG. 1 also includes a state machine. An example of the state machine is shown in FIG. 4. The state machine determines the possible setting for the LNA and the VGA. The gain distribution block begins with the estimated power level of the input signal which is stored in the state machine and based upon the gain results from the on/off control module which either increases or decreases the signal by 3 dB as in the flow chart of FIG. 3A or by as much as 6 dB in the flow chart of FIG. 3B, the gain distribution module accesses a look-up table 400 and obtains the LNA and VGA gain settings depending on the state 410. The current gain is fed back to the on/off control module 112. If the maximum or minimum gain is reached the on/off control module will be set to off. The values found within the look-up table are the result of empirical tests. Thus, depending upon the measured performance of the analog front-end and the type of signal, the values may differ.

Figure 5:
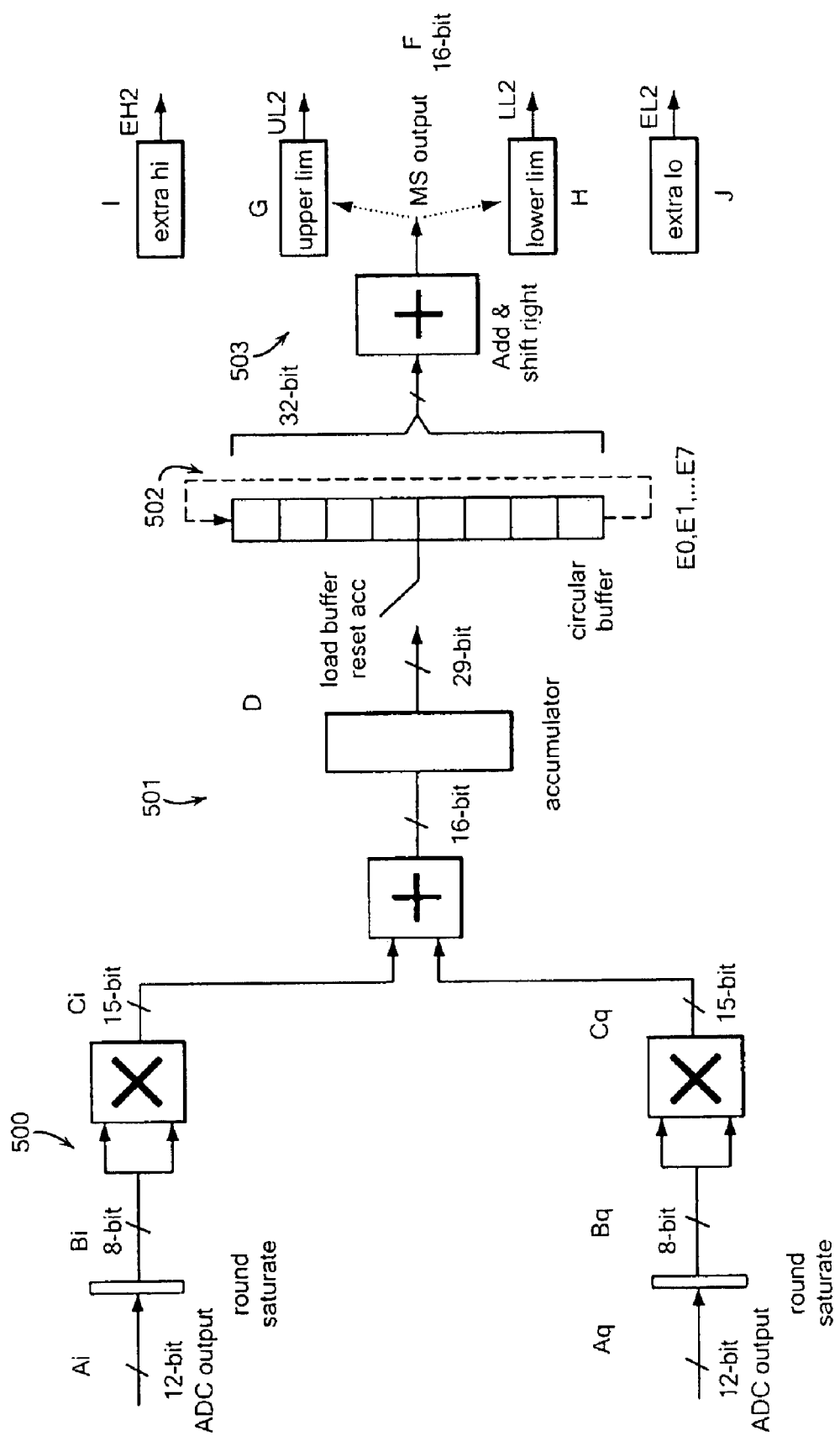
FIG. 5 shows a version of the circuitry within a digital MS module.

The second loop 120 of FIG. 1 is now addressed. One distinction between the first loop 110 and the second loop 120 is that the first loop 110 runs independently of the second loop 120 in terms of the gain determination. The second loop 120 uses the results 130 of the on/off control module 112 in the first loop 110 for determining the gain setting of the second loop. In such an embodiment, the combined gain of the first and the second loop is limited. For example, in one embodiment, the combined gain can be between −3 dB and +3 dB. In another embodiment, the overall gain of the AGC is limited to −6 dB and +6 dB, limiting the gain difference between signals. Once the baseband input signal is passed from the VGA 104 to the LPF 125, the LPF 125 passes the desired signal to an analog to digital converter 130. The analog to digital converter 130 converts the input signal to a digital variant and passes the OFDM signal samples to the output. The digital data is also passed to a digital mean square (MS) module 126. The digital MS module 126 is a moving average circuit that is implemented with a squarer 500, followed by an accumulator 501, followed by a circular buffer 502, followed by an adder 503 as shown in FIG. 5. The four outputs EH2, UL2, LL2, and EL2 of the digital MS module are comparator outputs with output F. As a result, the five outputs possibilities are [0000], [0001], [0011], [0111] and [1111]. Thus, in this embodiment, there are five possible levels.

Figure 5B:
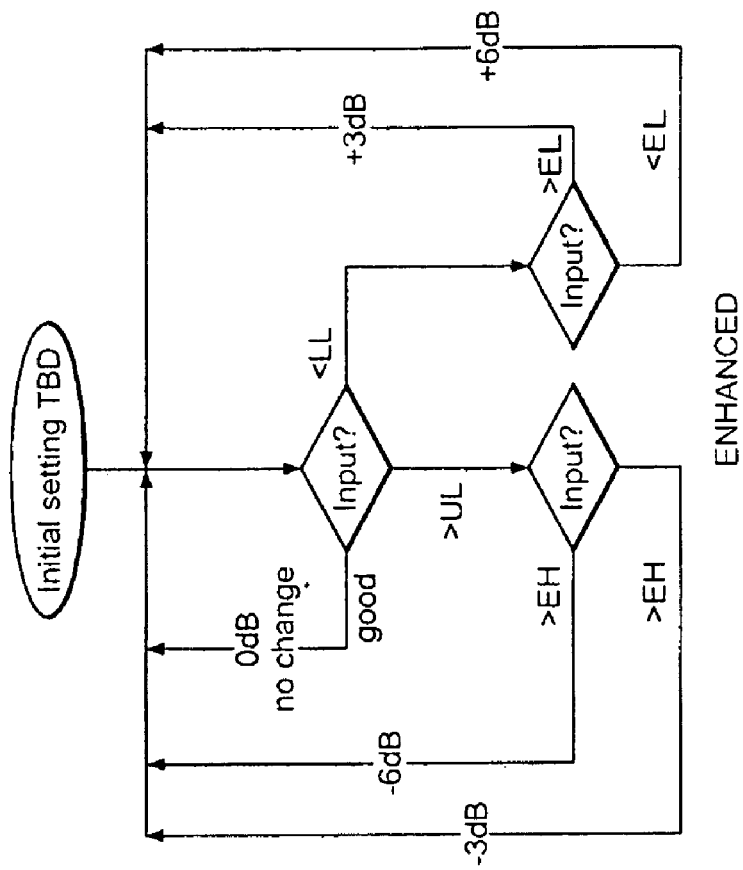
FIG. 5B shows a flow chart for an advanced mode embodiment of the on-off control module of the second loop.
Figure 5A:
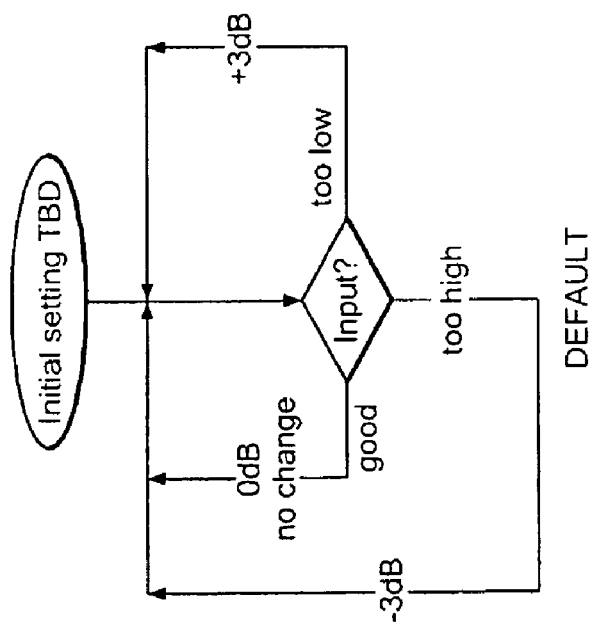
FIG. 5A shows a flow chart of for an embodiment of the on-off control module of the second loop.

The on/off control circuitry 127 operates similar to the on/off control 112 of the first loop 110. The on/off control 127 compares the input to the expected power value and can adjust the gain up or down stepwise. In one embodiment the steps are 3 dB steps in other embodiments, the steps may be other step values. As with FIGS. 3A and FIGS. 3B the on/off control circuitry can be configured to have three possible settings (−3 dB, 0, +3 dB), or five possible settings (−6 dB, −3 dB, 0, +3 dB, +6 dB). The invention as disclosed should not be seen as limited to 3 or 6 settings. In one embodiment described the on/off control circuitry could include a state machine capable of implementing the flow charts of either FIG. 3A or 3B. In other embodiments, the flow charts may not include the blocks for checking whether the minimum or maximum gain is reached as shown in FIGS. 5A and 5B. Rather, the subsequent gain control module 128 could be designed to include the feature as described below.

The gain control module 128 of the second loop 120 is simpler than that of the first loop, since there is only a single gain that must be determined for the LPF 125, rather than the two gain values for the first loop. The gain is calculated using the following formula:

Gain for Second Loop=Output(On/Off control 2)−(Output Loop 1)

As a result, if an embodiment employing the flow charts of FIGS. 3A and 5A are used, then the possible change in gain values for the AGC circuit may be −6 dB, −3 dB, 0, 3 dB or +6 dB. However, the overall change in gain of the AGC circuit is limited to a set range. For example, in one embodiment, the gain change for the entire AGC circuit (first and second loops) is limited to −3 dB, 0 dB, and +3 dB. Thus, if the change in gain for both the first and second loops combined is greater than +3 dB or less than −3 dB, the automatic gain control circuit will limit the overall change in gain between −3 dB and +3 dB. Additionally, the automatic gain control circuit favors the change in gain determined for the first loop. If the change in gain for the first loop is +3 dB and the change in gain determined for the second loop is +3 dB, the automatic gain control would limit the change in gain to +3 dB and the gain for the first loop would be changed by +3 dB while no change would occur for the second loop. If the flow charts of FIGS. 3B and 5B are employed, the possible gain changes for the entire AGC circuit are −12 dB, −9 dB, −6 dB, −3 dB, 0 dB, +3 dB, +6 dB, +9 dB, and +12 dB. Even though the two flow charts can produce gain changes between −12 and 12 dBs, the AGC circuit limits the overall gain change, for example, between −6 dB to +6 dB. Again, the change in gain for the first loop is given preference over the change in gain for the second loop.

Figure 6:
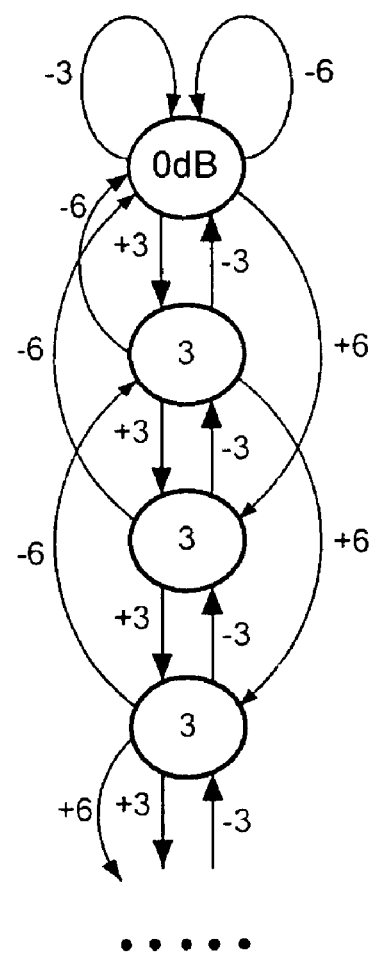
FIG. 6 shows a state diagram for the gain calculation module of the second loop.
Figure 6:
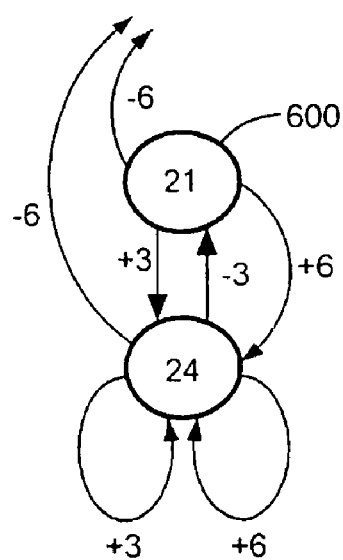

FIG. 6 shows a state diagram for the state machine of the gain calculation module of the second loop, wherein the gain of the first loop is taken into account. FIG. 6 assumes that the on/off control for loop 2 employs the flow chart of FIG. 5B.

In the diagram, the state 600 is equivalent to the current filter gain for the LPF. If the filter gain is 3 dB to start and the gain from loop 1 is equal to −3 dB and the calculated gain from the on/off control module of loop 2 is +3 dB, then the gain for the LPF is equal to +3 dB−(−3 dB)=+6 dB. Thus, the LPF is set to have a +6 dB gain and thus, the gain setting for the LPF would be +9 dB.

If the filter gain for the LPF approaches either the minimum or maximum gain allowable gain for the LPF, the gain can not be below the minimum or above the maximum. Thus, the state machine takes into account these limitations. If the initial gain of the LPF is 0 dB and the gain from the first loop is +3 dB and the gain from the on/off control from the second loop is −3 dB then the gain of the LPF according to the formula is −3 dB−3 dB which is −6 dB. However, the gain for the LPF cannot go below 0 dB and therefore the gain remains at 0 dB.

The timing for the AGC operates in the following sequence. An update pulse is generated and provided to each module of the AGC. The Analog MS detector issues a pulse indicative of +3 dB, 0, −3 dB to the gain distribution module of the first loop and to the gain calculation module of the second loop. The gain distribution module outputs the LNA and VGA gains and updates the state for the state machine of FIG. 4. The gain distribution module (GDM) 109 issues two outputs. The GDM 109 sends the LNA gain setting to the LNA 105. The LNA setting may be one of a plurality of values. In one empirical testing, the LNA values are −6, 0, 6, 12, 18 or 24 dB. The GDM 109 also outputs the VGA setting which in one empirical listing may be any of ten settings between 0 dB and 27 dB in steps of 3 dB to the VGA 104. The GDM 109 passes the VGA setting to a delay prior to the VGA 104 receiving the VGA gain setting. It should be understood by one of ordinary skill in the art, that the settings can differ for different embodiments prior to providing.

Once the second loop receives both the AGC update pulse and the gain output of the first loop, the second loop calculates the needed gain change in the gain calculation module 128. The gain calculation module 128 uses the output of the on/off module 127 from the second loop 120, the gain from the first loop 130 and the state, to determine the gain setting for the LPF 104. The delay blocks synchronize the passing of the gains to the amplifiers. The gains are then provided to the three analog blocks (LNA, VGA, and LPF). The AGC stays in a frozen state until a new update pulse is transmitted.

Figure 7:
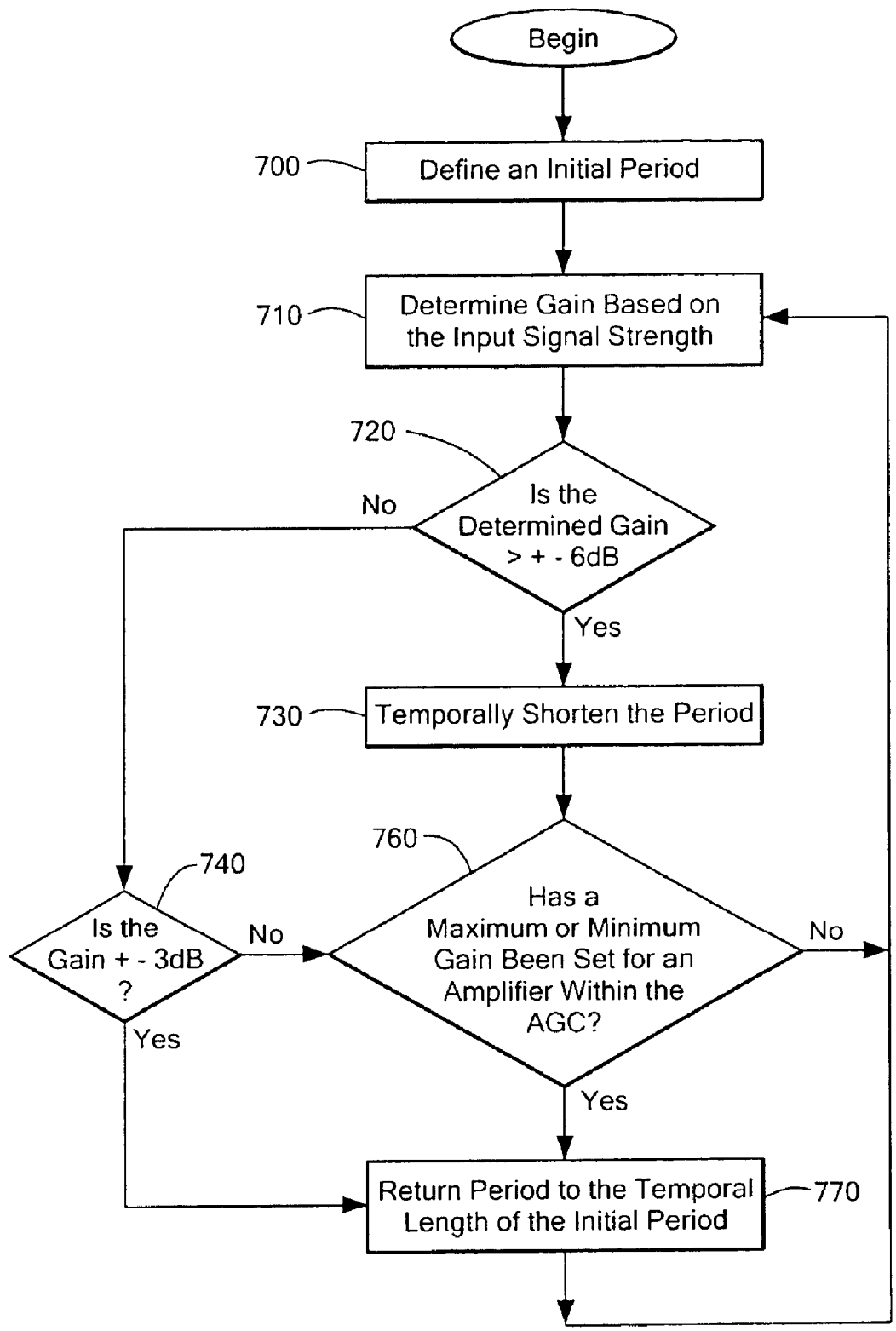
FIG. 7 shows a flow chart for an embodiment where the rate at which the gain is updated varies.

In another embodiment, the speed at which the gain is updated may be varied as shown in FIG. 7. For example, if the gain of the input signal is changing rapidly, the system can accelerate or decelerate the updated rate. A minimum period is defined by the update pulse. For example, the period between update pulses may be the length of time for processing one symbol. After the period is defined, the AGC determines the Gain for the first loop based upon the input signal's strength. The AGC queries whether the determined Gain is greater than 6 dB (720). If the AGC detects a needed gain change of more than 6 dB, the next update pulse arrives at a time shorter than the minimum period (730). In one embodiment, the update rate is doubled and for each additional increase in rate, the rate is doubled again. The analog MS detector determines the power level and outputs a signal if the rate is + or −6 dB above/below the expected power level. As before, the overall gain for the two loops is limited to a predetermined value, such as 3 dB.

On subsequent iterations through the loops of the AGC, if the need gain is less than 6 dB, the AGC checks to see if the Gain is less than 3 dB (740). If only a 3 dB gain change is needed as sensed by the analog MS detector, the AGC reverts back to the original minimum period (770). Additionally, if the maximum or minimum gain is reached for any of the amplifiers (760), the AGC circuit times out and reverts to the original period (770). The process repeats until an update counter reaches a minimum update period. If the AGC does not detect a gain change, the update counter reverts to the originally loaded value. It should be noted FIG. 7 is an exemplary flow chart showing one embodiment for varying the update rate of the AGC.

Although various exemplary embodiments of the invention have been disclosed, it should be apparent to those skilled in the art that various changes and modifications can be made which will achieve some of the advantages of the invention without departing from the true scope of the invention. These and other modifications are intended to be covered by the appended claims.

What is claimed is:

1. An automatic gain control circuit, the circuit comprising:
an input for receiving in a radio frequency signal;
a first gain loop having a changeable overall gain, the first gain loop operating on the radio frequency signal;
a first programmable gain amplifier and a second programmable gain amplifier in the first gain loop;
a filter for filtering the radio frequency signal;
a second gain loop receiving the filtered radio frequency signal and having a changeable overall gain;
the second gain loop including a digital to analog converter for converting the filtered radio frequency signal into a digital output;
at least one signal detector for detecting a signal level in the first gain loop and a signal level in the second gain loop;
a gain distribution module for determining the overall gain for the first gain loop and distributing the overall gain of the first gain loop between the first programmable gain amplifier and the second programmable gain amplifier;
an adjustment module for adjusting the gain of the second gain loop based upon the detected signal level of the second gain loop and the overall gain for the first gain loop wherein overall gain of the first and the second gain loops is increased no greater than a predetermined value.

2. The automatic gain control circuit according to claim 1, wherein the first programmable gain amplifier is an RF amplifier and wherein the second programmable gain amplifier is a baseband amplifier.

3. An automatic gain control circuit, the circuit comprising:
an input for receiving in a radio frequency signal;
at least a first gain loop having a first programmable gain amplifier and a second programmable gain amplifier operating on the radio frequency signal;
at least one signal detector for detecting a signal level in at least the first gain loop;
an adjustment module for adjusting the overall gain of the first gain loop based upon the detected signal level wherein the adjustment module determines an adjusted overall gain for the first loop and based on a look-up table, determines an adjusted gain in the first programmable gain amplifier and an adjusted gain in the second programmable gain amplifier that is equal to the determined adjusted overall gain for the first loop.

4. The automatic gain control circuit according to claim 3, wherein the gain of the first programmable gain amplifier and the gain of the second programmable gain amplifier in the look-up table are based on empirical data.

5. The automatic gain control circuit according to claim 3, wherein the first programmable gain amplifier is an RF amplifier and wherein the second programmable gain amplifier is a baseband amplifier.

6. The automatic gain control circuit according to claim 5 wherein the radio frequency signal includes a plurality of symbols wherein the radio frequency signal has an associated symbol rate.

7. The automatic gain control circuit according to claim 3 further comprising a second gain loop wherein the gain of both the first gain loop and the second gain loop are adjusted in steps.

8. The automatic gain control circuit according to claim 7, wherein the steps are 3dB steps.

9. The automatic gain control circuit according to claim 3, wherein the adjustment module contains a look-up table for setting gain in the first programmable gain amplifier and the second programmable gain amplifier.

10. An automatic gain control circuit, the circuit comprising:
an input for receiving in a radio frequency signal;
a first gain loop having a changeable gain, the first gain loop operating on the radio frequency signal;
a filter for filtering the radio frequency signal;
a second gain loop receiving the filtered radio frequency signal having a changeable gain;
at least one signal detector for detecting a signal level in the first gain loop and a signal level in the second gain loop;

an adjustment module for adjusting the gain of the first and second gain loops based upon the detected signal levels wherein overall gain of the first and the second gain loops is increased no greater than a predetermined value;

a digital output for outputting a digital signal from the second gain loop;

wherein the radio frequency signal includes a plurality of symbols wherein the radio frequency signal has an associated symbol rate; and wherein the gain of the first gain loop and the gain of the second gain loop are updated at substantially the symbol rate.

11. An automatic gain control circuit, the circuit comprising:

an input for receiving in a radio frequency signal;

a first gain loop having a changeable gain, the first gain loop operating on the radio frequency signal;

a filter for filtering the radio frequency signal;

a second gain loop receiving the filtered radio frequency signal having a changeable gain;

at least one signal detector for detecting a signal level in the first gain loop and a signal level in the second gain loop;

an adjustment module for adjusting the gain of the first and second gain loops based upon the detected signal levels wherein overall gain of the first and the second gain loops is increased no greater than a predetermined value;

a digital output for outputting a digital signal from the second gain loop;

wherein the radio frequency signal includes a plurality of symbols wherein the radio frequency signal has an associated symbol rate; and wherein the gain of the first gain loop and the gain of the second gain loop are updated at greater than the symbol rate.

12. The automatic gain control circuit according to claim 11 wherein if the gain detected by the first signal detector is greater than a threshold value increasing the rate at which the gain of the first loop and the second loop are updated.

13. A method for maintaining a desired signal level for an output digital signal from a received analog signal, the method comprising:

receiving the received analog signal;

measuring the signal level of the received analog signal;

determining a gain for amplifying the received analog signal in a first loop based at least on the measured signal level;

filtering the received analog signal;

converting the filtered signal to a digital signal;

measuring the signal level of the digital signal;

determining as part of a second loop a gain for amplifying the digital signal based at least on the measured signal level;

wherein the gain for the second loop depends on the gain of the first loop and wherein a combined gain of the gain of the first and second loops is not increased more than a predetermined amount.

14. A method for maintaining a desired signal level according to claim 13, wherein the gain of the first and second loops is not decreased more than a predetermined amount.

15. A method for maintaining a desired signal level according to claim 13, wherein the gain of the first loop and the gain of the second loop are updated once every update period.

16. A method for maintaining a desired signal level for digital signal within a received analog signal, the method comprising:

receiving the received analog signal;

measuring the signal level of the received analog signal;

determining a gain for amplifying the received analog signal in a first loop based at least on the measured signal level;

filtering the received analog signal;

converting the filtered signal to a digital signal;

measuring the signal level of the digital signal;

determining as part of a second loop a gain for amplifying the digital signal based at least on the measured signal level;

wherein the gain for the second loop depends on the first loop and wherein a combined gain of the gain of the first and second loops is not increased more than a predetermined amount;

wherein the gain of the first loop and the gain of the second loop are updated once every update period;

wherein if the signal level of the first loop is outside of a desired signal range, modifying the update period.

17. A method for maintaining a desired signal level for digital signal within a received analog signal, the method comprising:

receiving the received analog signal;

measuring the signal level of the received analog signal;

determining a gain for amplifying the received analog signal in a first loop based at least on the measured signal level;

filtering the received analog signal;

converting the filtered signal to a digital signal;

measuring the signal level of the digital signal;

determining as part of a second loop a gain for amplifying the digital signal based at least on the measured signal level;

wherein the gain for the second loop depends on the first loop and wherein a combined gain of the gain of the first and second loops is not increased more than a predetermined amount;

wherein the gain of the first loop and the gain of the second loop are updated once every update period;

wherein if the signal level of the second loop is outside of a desired signal range, modifying the update period.

* * * * *